United States Patent [19]

Tiemann et al.

[11] Patent Number: 5,187,482

[45] Date of Patent: Feb. 16, 1993

[54] DELTA SIGMA ANALOG-TO-DIGITAL CONVERTER WITH INCREASED DYNAMIC RANGE

[75] Inventors: Jerome J. Tiemann; Steven L. Garverick, both of Schenectady, N.Y.

[73] Assignee: General Electric Company, Schenectady, N.Y.

[21] Appl. No.: 844,029

[22] Filed: Mar. 2, 1992

[51] Int. Cl.$^5$ .................. H03M 3/02; H03M 3/04; H03M 1/18

[52] U.S. Cl. .................. 341/143; 341/166; 341/139

[58] Field of Search ............ 341/143, 155, 139, 166, 341/144

[56] References Cited

U.S. PATENT DOCUMENTS

| | | | |
|---|---|---|---|
| 4,541,102 | 9/1985 | Grallert | 341/143 X |
| 4,977,403 | 12/1990 | Larson | 341/143 |
| 5,030,954 | 7/1991 | Ribner | 341/172 |
| 5,039,989 | 8/1991 | Welland et al. | 341/143 |
| 5,065,157 | 11/1991 | Ribner et al. | 341/143 |
| 5,084,702 | 1/1992 | Ribner | 341/143 |
| 5,101,205 | 3/1992 | Yasuda | 341/143 X |
| 5,103,229 | 4/1992 | Ribner | 341/143 |
| 5,124,703 | 6/1992 | Kaneaki et al. | 341/143 |

OTHER PUBLICATIONS

J. C. Candy, "A Use of Limit Cycle Oscillators to Obtain Robust Analog to Digital Converters", IEEE Transactions on Communications, vol. COM-22, No. 3, Mar. 1974, pp. 298-305.

J. C. Candy et al., "Using Triangularly Weighted Interpolation to get 13-Bit PCM from a Sigma-Delta Modulator", IEEE Transactions on Communications, vol. COM-24, No. 11, Nov. 1976, pp. 1268-1275.

J. C. Candy, "A Use of Double Integration in Sigma Delta Modulation", IEEE Transactions on Communications, vol. COM-33, No. 3, Mar. 1985, pp. 249-258.

Primary Examiner—Sharon D. Logan
Attorney, Agent, or Firm—Marvin Snyder

[57] ABSTRACT

A delta sigma analog-to-digital (A/D) converter includes a digitally-controlled multiplying digital-to-analog converter (MDAC) in a feedback configuration. The MDAC is driven by a digital signal obtained from the output (or an intermediate output) of the A/D converter. An incremental feedback quantum to the first stage integrator is a function of the input values that immediately precede it. In the most general implementation, a table look-up permits an arbitrary relation between the input values and feedback quantum size. In another implementation, the A/D converter output (or intermediate output) signal drive the MDAC and the compression curve of the A/D converter bears a square-root relationship to the input analog signal; a linear relationship is restored by squaring the output signal. In a third implementation, the MDAC is driven by a digital signal obtained from the output (or an intermediate output) of the A/D converter together with an added small positive constant number. In this implementation, the compression curve starts out approximately linear and approaches a square-root relationship at the high end of the scale, while a linear relationship is restored by providing the feedback loop, in the digital domain, with the same value of signal as employed in the analog domain.

9 Claims, 5 Drawing Sheets

DELTA SIGMA ANALOG-TO-DIGITAL CONVERTER WITH INCREASED DYNAMIC RANGE

CROSS REFERENCE TO RELATED APPLICATION

This application is related in subject matter to co-pending U.S. patent application Ser. No. 07/844,030 filed Mar. 2, 1992 by Jerome J. Tiemann for "Wide Dynamic Range Delta Sigma Analog-to-Digital Converter with Precise Gain Tracking" and assigned to the present assignee. The subject matter thereof is hereby incorporated by reference.

BACKGROUND OF THE INVENTION

1. Field of the Invention

The present invention generally relates to oversampled or delta sigma ($\Delta\Sigma$) analog-to-digital (A/D) converters and, more specifically, to a delta sigma A/D converter whose resolution tracks the noise level of the signal to be converted, thereby increasing the dynamic range of the conversion process.

2. General Description of the Prior Art

High resolution analog-to-digital (A/D) signal conversion can be achieved with lower resolution components through the use of oversampled interpolative (or delta sigma) modulation followed by digital low pass filtering and decimation. Oversampling refers to operation of the modulator at a rate many times greater than the Nyquist rate, whereas decimation refers to reduction of the clock rate by periodic deletion of samples.

Delta sigma modulators (sometimes referred to as sigma delta modulators) have been used in A/D converters for some time. Detailed general information can be obtained from the following technical articles which are hereby incorporated by reference:

1) "A Use of Limit Cycle Oscillators to Obtain Robust Analog to Digital Converters", J. C. Candy, *IEEE Transactions on Communications*, vol. COM-22, no. 3, March 1974, pp. 298-305
2) "Using Triangularly Weighted Interpolation to Get 13-Bit PCM from a Sigma-Delta Modulator", J. C. Candy et al., *IEEE Transactions on Communications*, vol. COM-24, no. 11, November 1976, pp. 1268-1275
3) "A Use of Double Integration in Sigma Delta Modulation", J. C. Candy, *IEEE Transactions on Communications*, vol. COM-33, no. 3, March 1985, pp 249-258

Broadly described, a delta sigma A/D converter uses an internal A/D converter of modest resolution and a complementary digital-to-analog (D/A) converter in a feedback loop. The feedback loop increases the accuracy of the A/D converter in a manner consistent with the high speed operation afforded by the internal A/D converter. In theory, any error in linearity or resolution caused by the D/A converter is effectively added to the input signal and appears at the output without attenuation.

Substantial effort has been expended in the field of oversampled A/D converter design to develop a delta sigma A/D converter with an increased dynamic range. Delta sigma A/D converters employ an analog integrator at the input to assure that the average of the digital output bits equals the average of the signal. This makes them inherently linear (assuming that the integrator is linear); however, a linear A/D converter wastes resolution in cases where the noise level is not uniform with signal amplitude. Attempts to match delta sigma A/D converters to applications that have non-uniform noise levels have used companding, but use of companding may make it necessary to restore linearity. This requires an exactly invertible companding characteristic.

SUMMARY OF THE INVENTION

It is therefore an object of the present invention to provide an A/D converter having all of the desirable features of a delta sigma A/D converter but with greatly extended dynamic range. Another object of the invention is to provide a delta sigma A/D converter whose resolution tracks the noise level of the signal to be converted.

A further object of the invention is to provide a delta sigma A/D converter with a completely arbitrary compression or expansion characteristic.

Yet another object of the invention is to provide a delta sigma A/D converter with a variable compression characteristic, and in particular a compression characteristic that can be adaptively varied under computer control.

Still another and more specific object of the invention is to provide a delta sigma A/D converter for quantum detectors such that the quantization error is proportional to the square root of the detected signal amplitude.

According to the invention, a conventional delta sigma A/D architecture (of any desired order) is modified by adding a digitally-controlled multiplying digital-to-analog converter (MDAC) to the positive and negative reference voltages. The MDAC is driven by a digital control signal that is derived from the output (or an intermediate output) of the delta sigma A/D converter itself. Thus the incremental feedback quantum to the first stage integrator becomes a function of the input values that immediately precede it.

In its most general form, this invention involves a table look-up which permits an arbitrary relation between the input values and the feedback quantum size, but a particularly useful implementation of the invention is somewhat simpler. More specifically, the output (or intermediate output) signal is used directly without modification. In this case, the compression curve of the A/D conversion becomes a square-root relationship; that is, the output signal is proportional to the square-root of the input signal. A linear relationship is restored by simply squaring the output signal. This doubles the number of bits in the final output signal so that a converter with ten bits, nominal dynamic range produces numbers that span twenty bits and the quantum at full scale will be 1024 times larger than the quantum at the lowest level. This is highly desirable in quantum detectors such as charge injection device (CID) or charge coupled device (CCD) imagers and the like, because the quantum shot noise in these devices is not constant but varies approximately as the square root of the total number of detected quanta. Thus, a resolution step that varies in the same proportion produces a quantization error that is always commensurate with the noise level.

In a variation of this specific implementation, the MDAC is driven by a digital control that is derived from the output (or an intermediate output) signal of the delta sigma A/D converter itself by adding a small positive constant value to that output signal. This configuration improves loop stability for small input signals since the incremental feedback quantum is never allowed to be zero. The incremental feedback quantum to the first stage integrator increases as the signal level increases, but the size of the quantum approaches a constant at the low end of the scale. As a result, the compression curve of the A/D converter starts out approximately linear and approaches a square-root relationship at the high end of the scale. The linear relationship is restored simply by repeating in the digital domain exactly the same operations as are performed in the feedback loop in the analog domain. That is, the digital bits from the comparator are multiplied by the digital intermediate output signal to form digital output words to the decimation filter just as they are multiplied by the MDAC in the feedback loop. Since the comparator output signal is only a single bit, this multiplication operation is actually only a choice of adding or not adding the intermediate output signal.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF THE PREFERRED EMBODIMENTS OF THE INVENTION

Figure 1:
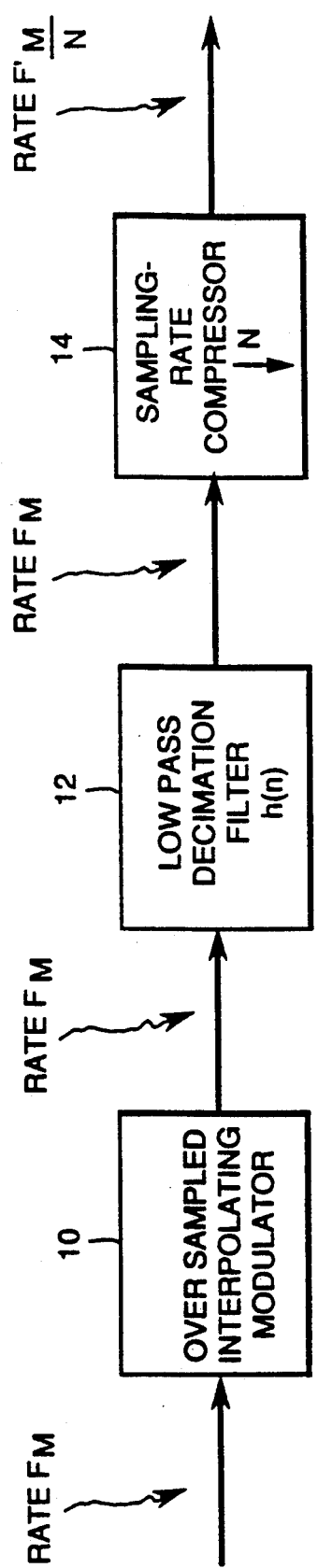
FIG. 1 is a high level block diagram illustrating a known delta sigma A/D converter design.

FIG. 1 illustrates, in high level block diagram form, an example of a prior art delta sigma A/D converter. In the example illustrated, a delta sigma modulator 10 is coupled to a low pass decimation filter 12 which, in turn, is coupled to a samplingrate compressor 14. The role of modulator 10 is to shape spectrally the quantization noise of a low resolution A/D converter so that it is predominantly concentrated at a high frequency. The input signal x(n) to modulator 10 is a pure sinusoid and is sampled by modulator 10 at a sampling rate of $F_M$. Subsequent low pass filtering and decimation are used to remove the bulk of the quantization noise, resulting in a high resolution digital output signal at a reduced conversion rate of $F_M/N$, where N is the oversampling ratio, or ratio of the output clock rate (F') to the input clock (or sample) rate $F_M$.

Figure 2:
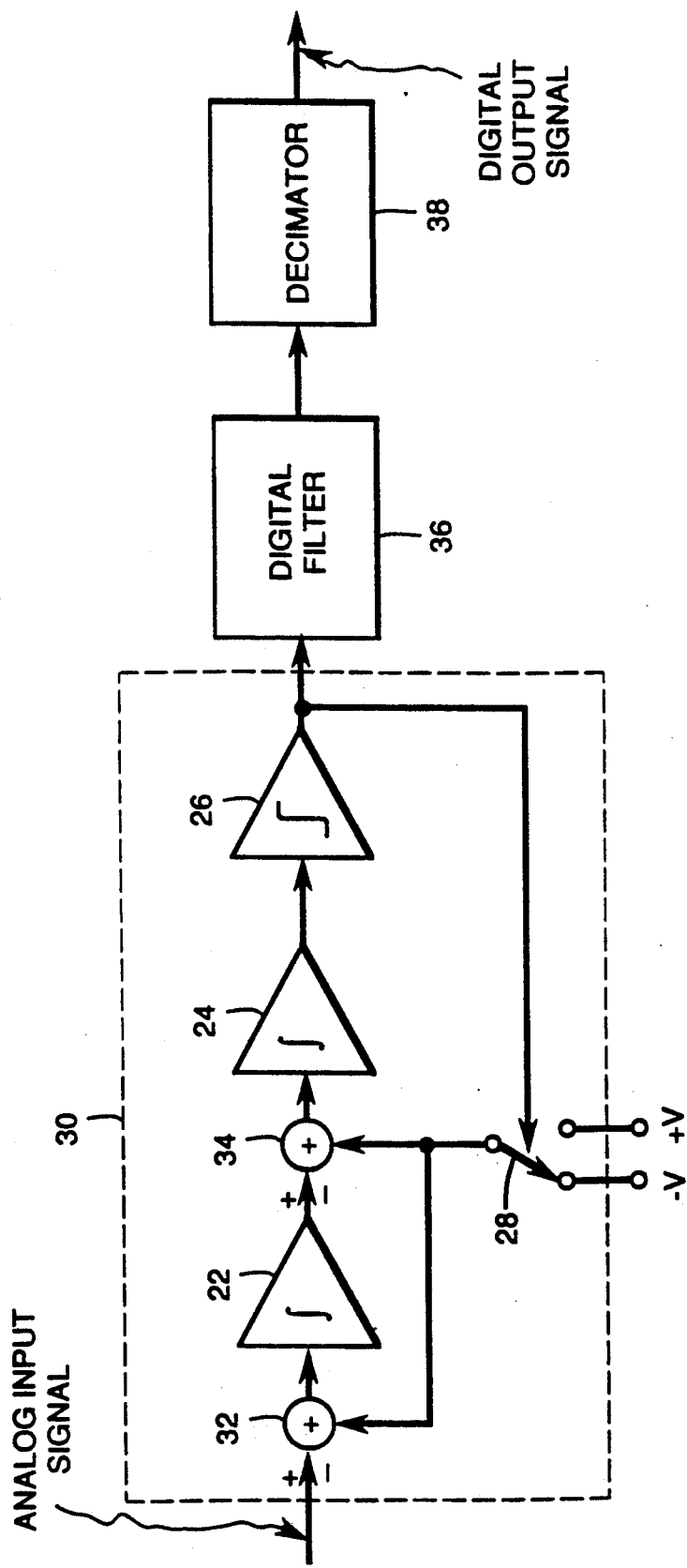
FIG. 2 is a more detailed block diagram of a specific example of a conventional delta sigma A/D converter.

FIG. 2 shows in greater detail a specific example of the delta sigma A/D converter shown in FIG. 1. In this example, the oversampled interpolating modulator 20 employs a second order integration loop. This loop comprises a pair of cascaded integrators 22 and 24, an analog-to-digital (A/D) converter 26 in the form of a comparator or threshold circuit, and a one-bit digital-to-analog (D/A) converter in the form of a switch 28 controlled by the output of A/D converter 26. Interposed between the input to modulator 20 and the input to the first integrator 22 is a first differential summing junction 32, and interposed between first integrator 22 and second integrator 24 is a second differential summing junction 34. Switch 28 connects either a negative voltage (−V) or a positive voltage (+V) to differential summing junctions 32 and 34 depending on the output signal from comparator 26. The output of modulator 20 is connected to a digital filter 36, the output of which is, in turn, connected to a decimator 38.

The delta sigma A/D converter shown in FIG. 2 forces the average fraction of digital "ones" (i.e., comparator 26 threshold exceeded) to equal the average of the input signal as a fraction of full scale. In this way, the quantization noise spectrum is decreased at low frequencies and increased at high frequencies. The high frequency quantization noise, which is above the signal bandwidth, is filtered out by digital filter 36 prior to decimation.

Figure 3:
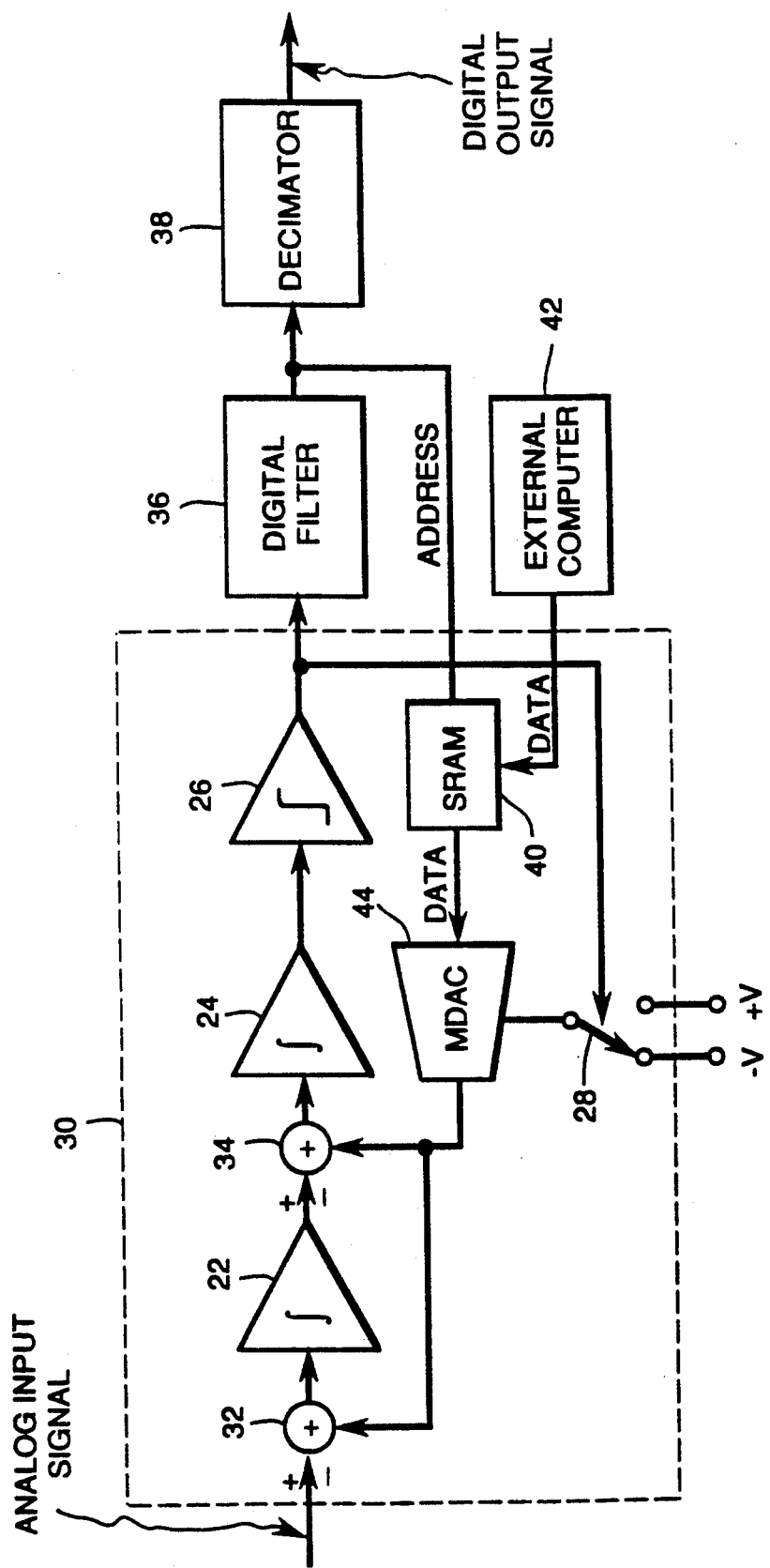
FIG. 3 is a block diagram of a delta sigma A/D converter with an arbitrary compression curve according to the general teachings of the invention.

In FIG. 3, the modification that is the subject of this invention is shown for the most general case; namely, where a completely arbitrary compression curve is to be implemented in the A/D conversion process. As in the conventional delta sigma A/D converter shown in FIG. 2, oversampled interpolative modulator 30 includes a second order integration loop which comprises a pair of cascaded integrators 22 and 24 and an A/D converter 26 in the form of a threshold circuit. As in the system of FIG. 2, threshold circuit 26 still controls switch 28 connected to negative and positive voltages (±V), but the switch is no longer directly connected to differential summing junctions 32 and 34; instead, the size of the feedback quantum is controlled by the output signal of the A/D converter through a static random access memory (SRAM) 40 table look-up that is under computer control by an external computer 42. In providing output data to SRAM 40, computer 42 may be responding to a discrepancy between a desired characteristic and the actual characteristic, or it may be delivering a predetermined characteristic that was stored in memory. In any case, the output words (or at least their most significant digits) furnished by digital filter 36 are used as address bits to access the desired quantum size stored in SRAM 40 to be used in immediately subsequent updates of the input integrator.

The data read out of SRAM 40 is read to a multiplying digital-to-analog converter (MDAC) 44 which multiplies either one of voltages −V and +V by the quantum size represented by the data. The resulting voltage output from MDAC 44 is then supplied to the differential summing junctions 32 and 34.

Figure 4:
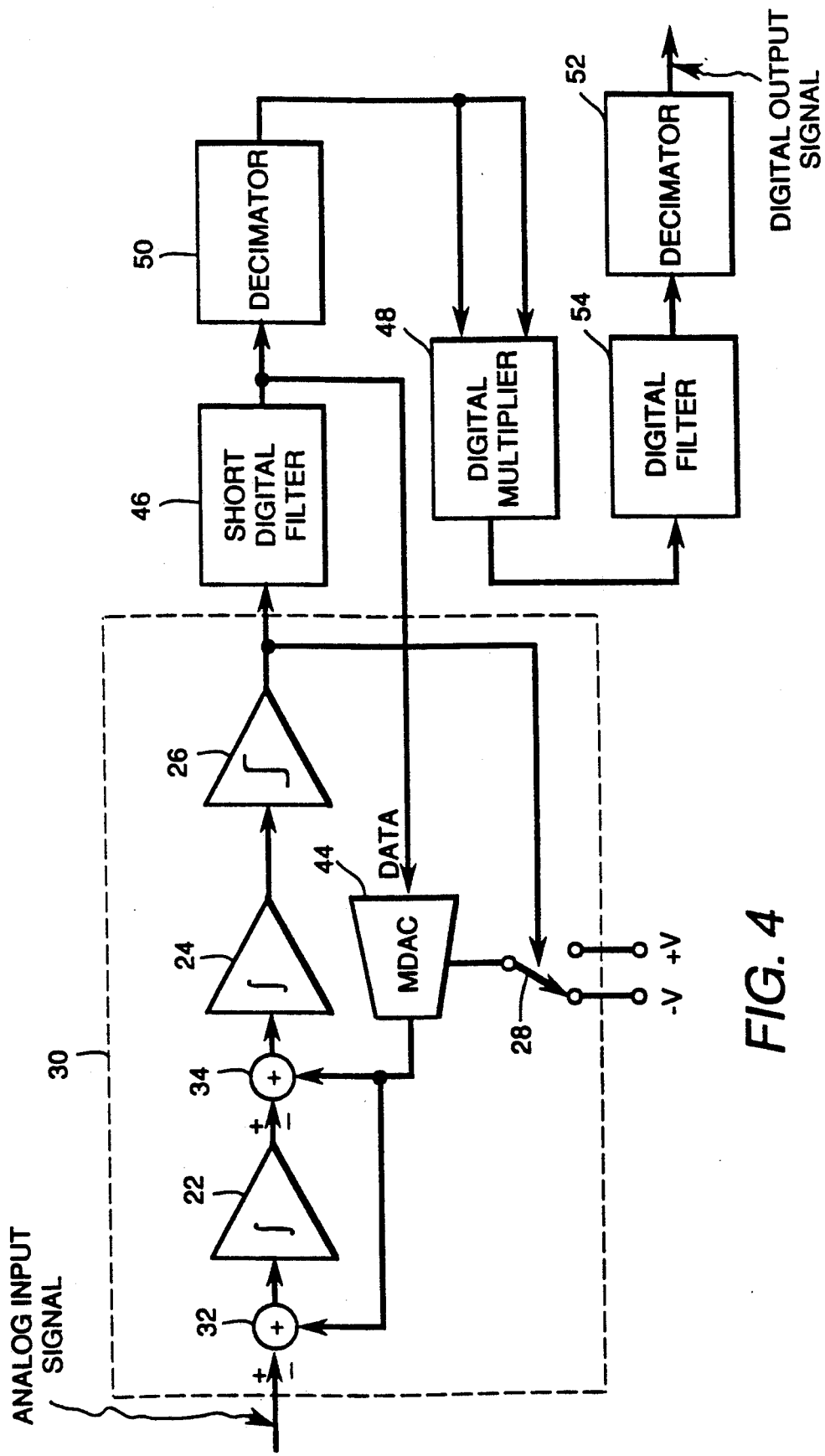
FIG. 4 is a block diagram of a specific implementation of a second order delta sigma A/D converter according to the invention, with a linear characteristic but with quantization noise proportional to the square-root of the signal level.

FIG. 4 illustrates a specific implementation of the invention in which the table look-up in oversampled, interpolative modular 30 is eliminated. In this embodiment, the feedback quantum is derived from a short digital filter 46 (i.e., a digital filter in which the impulse response duration, or duration over which the filter input samples are averaged, is less than ½, and preferably less than about ¼, of the output sampling interval) and is directly proportional to the signal level itself, This results in a compression curve whereby the output code magnitudes vary as the square-root of the input signal magnitudes. Thus, a linear relation between output and input signals can be restored simply by squaring the output code values. This is implemented by a digital multiplier 48.

In the FIG. 4 embodiment, the decimation process is divided into two decimator stages. The first decimator stage 50 is interposed between short digital filter 46 and digital multiplier 48 and produces an intermediate output signal of modest resolution, but which responds very quickly to changes in the input signal value. This assures that the square-root relationship will be accurately maintained. A second decimator stage 52 is employed after multiplier 48 and a second digital filter 54, and completes the reduction of sample rate to close to the Nyquist rate. Since this decimator is utilized after the multiplier, it must deal with values that are linearly related to the input signal. Thus averaging is correctly performed regardless of the variations in the signal.

Use of the two stages of decimation in the implementation of FIG. 4 emphasizes the need for the feedback quantum to promptly respond to changes in the input signal level. If it did not, then outdated, incorrect feedback quantum values might be used, causing a departure from the desired square-root relationship.

At first blush, the first stage decimator 50 might appear not to function properly because the compression curve defeats the linearity which is the basis for the filtering operation. In actual fact, however, under assumptions mentioned below, the signal does not change significantly during the averaging period, so the nonlinearity does not adversely affect proper functioning of decimator 50, provided that decimator 50 operates substantially faster than the Nyquist rate (i.e., the second decimator must have a substantial sample reduction rate, and there cannot be much signal energy outside the bandwidth of interest). The first decimation rate also cannot be small, for it must produce enough resolution to accurately control the feedback quantum size. If it cannot, then the square-root law would not be accurately implemented, and the overall compression curve would not be linear. Thus this invention ideally requires a large enough oversampling ratio such that the intermediate output signal to MDAC 44 has enough bits to closely represent the input signal while also being generated at a rate that is fast in comparison to a rate at which the signal changes amplitude.

Figure 5:
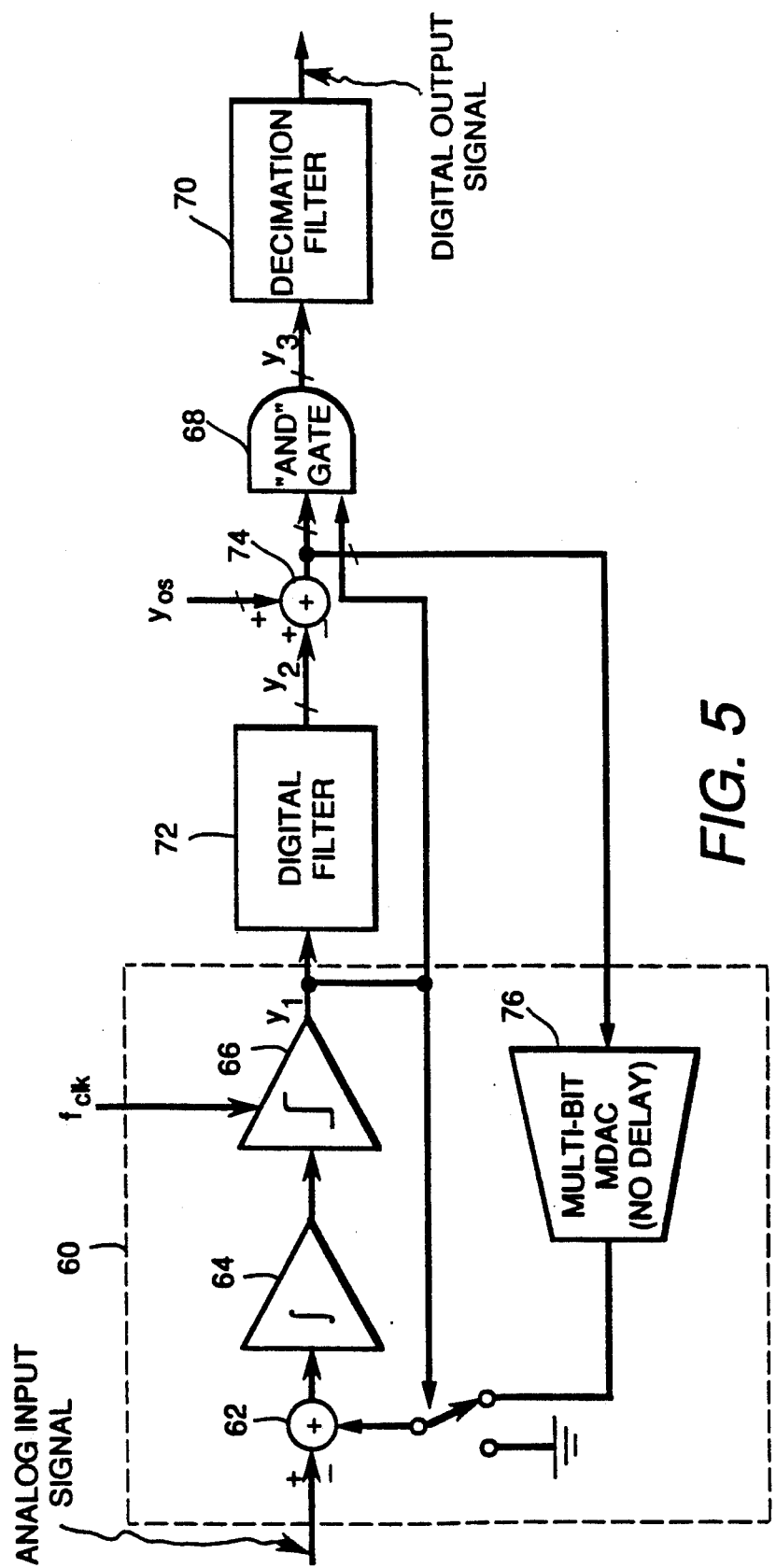
FIG. 5 is a block diagram of a second specific implementation of a first order delta sigma A/D converter according to the invention, with a compression curve that starts out approximately linear and approaches a square-root relationship.

FIG. 5 illustrates a further variation of the invention, i.e., an implementation that utilizes a first order delta sigma A/D converter. In this embodiment, one end of the input voltage range is taken to be ground. Thus the input signal to oversampled interpolative modulator 60 is added to a summing node 62 of an integrator 64 whose output signal drives a comparator 66 that is clocked at frequency $f_{clk}$. The bits supplied by comparator 66 and shown as signal $y_1$ are used to determine whether or not a feedback quantum will be subtracted from summing node 62, and also to determine whether or not an intermediate digital output code (shown as signal $y_3$) will be passed by an "and" gate 68 and supplied to a digital output filter comprising a decimation filter 70. If desired, a decimator (not shown) may be used to provide a decimated version of the output signal from filter 70 as the delta sigma analog-to-digital converter output signal. In addition, the comparator output bits are supplied to a digital filter 72 that is preferably shorter than the output filter 70 and whose output signal determines the size of the feedback quantum. The output codes from filter 72 (shown as signal $y_2$) and a small, constant, positive number, $y_{os}$, are added together in a summer 74 to form the control codes that are supplied to a multi-bit MDAC 76.

Since the control code bits identically deliver a digital value to the output and an analog quantity to the input, and since the feedback loop in which multi-bit MDAC 76 exhibiting no substantial delay is situated assures that the fed back values equal the input signal on the average, it follows that the output signal will track the input signal as closely as the analog output signal produced by MDAC 76 permits. Thus the output signal will vary linearly with the input signal even though the intermediate codes are nonuniformly distributed.

It is advantageous to distribute the intermediate codes non-uniformly whenever the inherent noise level is a variable function of the signal level. In this case, the addition of a small positive offset voltage to the output signal of intermediate filter 72 assures that the feedback quantum never goes to zero, thus resulting in stable behavior. In fact, at the low end of the scale, where the offset voltage dominates the filter output signal, the compression curve for the intermediate output signals becomes linear. At the high end of the scale, on the other hand, when the filter output signal dominates the offset voltage, the compression curve approaches a square-root relationship.

While only certain preferred features of the invention have been illustrated and described herein, many modifications and changes will occur to those skilled in the art. It is, therefore, to be understood that the appended claims are intended to cover all such modifications and changes as fall within the true spirit of the invention.
MS:nbK

Having thus described our invention, what we claim as new and desire to secure by Letters Patent is as follows:

1. A delta sigma analog-to-digital converter comprising:
   an oversampled interpolative modulator for receiving an input analog signal to be converted and generating an output digital signal;
   digital filter means coupled to receive the output digital signal of said oversampled interpolative modulator for generating a filtered digital output signal; and
   a decimator coupled to receive the filtered digital output signal of said digital filter for compressing the sampling rate of said filtered digital output signal;
   said oversampled interpolative modulator comprising:
      summing means for receiving said input analog signal and subtractively adding a voltage to generate a difference output signal;
      at least one integrator coupled to said summing means for integrating said difference output signal;
      comparator means coupled to said at least one integrator for generating a digital "one" or "zero" depending on whether the integrator output signal exceeds a predetermined threshold; and
      a digitally controlled multiplying digitalto-analog converter coupled to the output of said digital filter means and selectively coupled to either of a positive and negative reference voltage, and being responsive to a digital control signal derived, at least in part, from an output of said digital filter means.

2. The delta sigma analog-to-digital converter recited in claim 1 further comprising table look-up means coupling the output of said digital filter means to said multiplying digital-to-analog converter, for receiving as an address an output signal of said digital filter means and reading out data representing feedback quantum size to said multiplying digital-to-analog converter so as to thereby permit an arbitrary relation between the input analog signal values and the feedback quantum size.

3. The delta sigma analog-to-digital converter recited in claim 2 wherein said table look-up means comprises a static random access memory loaded with data by an external computer.

4. The delta sigma analog-to-digital converter recited in claim 1 wherein the analog-to-digital converter exhibits a compression curve bearing a square-root relationship to the input analog signal and further comprises multiplier means coupled to the output of said decimator for squaring the output signal of said digital filter means.

5. The delta sigma analog-to-digital converter recited in claim 4 wherein said digital filter means comprises a short digital filter.

6. The delta sigma analog-to-digital converter recited in claim 1 further comprising:

summing means coupled to the output of said digital filter means for adding an offset value to the filtered digital output signal and providing a digital sum output signal, said digital sum output signal being directly supplied to said multiplying digital-to-analog converter, whereby the analog-to-digital converter exhibits a compression curve that starts out approximately linear and approaches a square-root relationship with respect to the input analog signal; and gating means for passing filtered digital signals from the output of said summing means to said decimator in response to output signals of said comparator means.

7. The delta sigma analog-to-digital converter recited in claim 6 further including a decimation filter coupling the output of said gating means to said decimator.

8. The delta sigma analog-to-digital converter recited in claim 1 wherein said oversampled interpolative modulator is a second order modulator comprising two cascaded integrators.

9. The delta sigma analog-to-digital converter recited in claim 1 wherein said oversampled interpolative modulator is a first order modulator comprising a single integrator.

* * * * *